United States Patent
Chang

(10) Patent No.: US 9,286,820 B2
(45) Date of Patent: Mar. 15, 2016

(54) THIN FILM TRANSISTOR ARRAY PANEL AND DISPLAY DEVICE INCLUDING THE SAME

(71) Applicant: Samsung Display Co., Ltd., Yongin, Gyeonggi-Do (KR)

(72) Inventor: Jong Woong Chang, Asan-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 14/169,475

(22) Filed: Jan. 31, 2014

(65) Prior Publication Data

US 2015/0001540 A1    Jan. 1, 2015

(30) Foreign Application Priority Data

Jun. 26, 2013    (KR) .................. 10-2013-0073823

(51) Int. Cl.
*H01L 33/08*    (2010.01)
*G09G 3/20*    (2006.01)
*H01L 27/12*    (2006.01)

(52) U.S. Cl.
CPC ............ *G09G 3/20* (2013.01); *G09G 2300/043* (2013.01); *G09G 2300/0413* (2013.01); *G09G 2320/0242* (2013.01); *G09G 2320/043* (2013.01); *H01L 27/124* (2013.01)

(58) Field of Classification Search
CPC ....................................................... H01L 33/08
USPC ......................................................... 257/59
See application file for complete search history.

(56) References Cited

U.S. PATENT DOCUMENTS

| 6,970,223 B2 | 11/2005 | Lee et al. |
| 7,489,326 B2 | 2/2009 | Park |
| 7,710,388 B2 | 5/2010 | Hirata et al. |
| 2005/0078240 A1* | 4/2005 | Murade .................. 349/110 |
| 2011/0007257 A1* | 1/2011 | Min et al. ............... 349/150 |

FOREIGN PATENT DOCUMENTS

| JP | 2005-208522 A | 8/2005 |
| JP | 2012-008224 A | 1/2012 |
| KR | 10-0438965 B1 | 6/2004 |
| KR | 10-0701670 B1 | 3/2007 |
| KR | 10-2009-0058986 A | 6/2009 |

* cited by examiner

*Primary Examiner* — Edward Wojciechowicz
(74) *Attorney, Agent, or Firm* — Knobbe, Martens, Olson & Bear, LLP

(57) ABSTRACT

A thin film transistor array panel and a display device including the same are disclosed. In one aspect, the thin film transistor array panel includes a plurality of dots located in a display area, each of the plurality of dots including a plurality of pixels, and a plurality of data lines applying data voltages to the plurality of pixels. The thin film transistor array panel also includes a plurality of first dummy data lines located in a first peripheral area of a peripheral area around the display area, the plurality of first dummy data lines are adjacent to a first edge of the display area. The thin film transistor array panel further includes plurality of first data lines applying data voltages to the pixels included in a first dot adjacent to the first edge and are respectively connected to the plurality of first dummy data lines.

16 Claims, 8 Drawing Sheets

THIN FILM TRANSISTOR ARRAY PANEL AND DISPLAY DEVICE INCLUDING THE SAME

CROSS-REFERENCE TO RELATED APPLICATIONS

This application claims priority to and the benefit of Korean Patent Application No. 10-2013-0073823 filed in the Korean Intellectual Property Office on Jun. 26, 2013, the entire contents of which are incorporated herein by reference.

BACKGROUND

1. Field

The described technology generally relates to a thin film transistor array panel and a display device including the same, and more particularly, to a thin film transistor array panel including a dummy data line and a display device including the same.

2. Description of the Related Technology

Commonly used display devices include liquid crystal displays, organic light-emitting diode (OLED) displays, electrophoretic displays and the like.

Display devices generally include a thin film transistor array panel having a plurality of pixels and a plurality of driving signal lines formed thereon.

Each of the pixels typically includes a switching element connected to the driving signal line and a pixel electrode. Each of the pixels inherently displays a primary color or alternately displays primary colors at predetermined times to allow a desired color to be recognized by a spatial or temporal sum of the primary colors. An example set of primary colors includes the colors red, green, and blue.

The driving signal lines typically include gate and data lines which respectively transmit gate and data signals. The gate signal may consist of a combination of a gate-on voltage and a gate-off voltage which can respectively turn on or off the switching element. The gate signal is typically generated from a gate driver and output to a plurality of gate lines according to a control signal received from a signal controller. The data signal is typically generated from a data driver by converting a digital image signal received from a signal controller to a data voltage.

The switching element is a three terminal element such as a thin film transistor and transmit a data voltage to a pixel electrode based on a received gate signal. The pixel electrode generates an electric field based on the received data voltage together with a predetermined voltage such as a common voltage received at a common electrode. For example, in a liquid crystal display, a pixel electrode and a common electrode may generate an electric field in a liquid crystal layer which determines the arrangement of liquid crystal molecules in the liquid crystal layer and thus controls polarization of incident light in order to display an image. In an OLED display, a pixel electrode and a common electrode apply a voltage difference to an emission layer between the pixel electrode and the common electrode to cause the emission layer to emit light.

The thin film transistor array panel generally includes a display area having a plurality of pixels located thereon to display an image, and a peripheral area around the display area. A driver for applying a driving signal to a driving signal line of the display area or a pad portion connected to the driver may be located at the peripheral area of the thin film transistor array panel, and the driver or the pad portion may be covered by a light blocking member.

The above information disclosed in this Background section is only for intended to facilitate understanding of the background of the described technology and therefore it may contain information that does not constitute the prior art that is already known in this country to a person of ordinary skill in the art.

SUMMARY OF CERTAIN INVENTIVE ASPECTS

One inventive aspect is a thin film transistor array panel and a display device including the same having the advantages of preventing light leakage in the edge of the display area and reducing defects in color representation quality.

Another aspect is a thin film transistor array panel and a display device including the same, including a plurality of dots located in a display area, each of the plurality of dots including a plurality of pixels, a plurality of data lines applying data voltages to the plurality of pixels, and a plurality of first dummy data lines located in a first peripheral area of a peripheral area around the display area, the plurality of first dummy data lines located outside a first edge of the display area, wherein a plurality of first data lines applying the data voltages to the plurality of pixels included in a first dot adjacent to the first edge of the display area among the plurality of dots are respectively connected to the plurality of first dummy data lines.

Each of the plurality of first data lines and each of the plurality of first dummy data lines may be paired and connected to each other.

The plurality of first data lines and the plurality of first dummy data lines may be connected to each other based on their order of arrangement on the thin film transistor array panel.

The first data lines and the first dummy data lines which are paired and connected to each other may be connected to each other through connection bridges located at a connection part.

The connection part may be located in the peripheral area.

The connection bridge may be located in a different layer from that of the first data line and the first dummy data line.

The first data lines and the first dummy data lines which are connected to each other may be connected to each other through a plurality of connection bridges at a plurality of connection parts.

The plurality of connection parts may include two connection parts located at respective ends of the first data line.

The plurality of pixels included in the first dot may display different primary colors.

A number of the plurality of first data lines may be equal to or less than a number of the plurality of pixels included in the first dot.

The thin film transistor array panel may further include a dummy pixel electrode located in the peripheral area.

The dummy pixel electrode and the dummy data line may be covered by a light blocking member.

According to at least one embodiment, light leakage in the edge of the display area may be prevented, and defects in color representation may be reduced in a thin film transistor array panel and a display device including the same.

DETAILED DESCRIPTION OF CERTAIN INVENTIVE EMBODIMENTS

Figure 1:
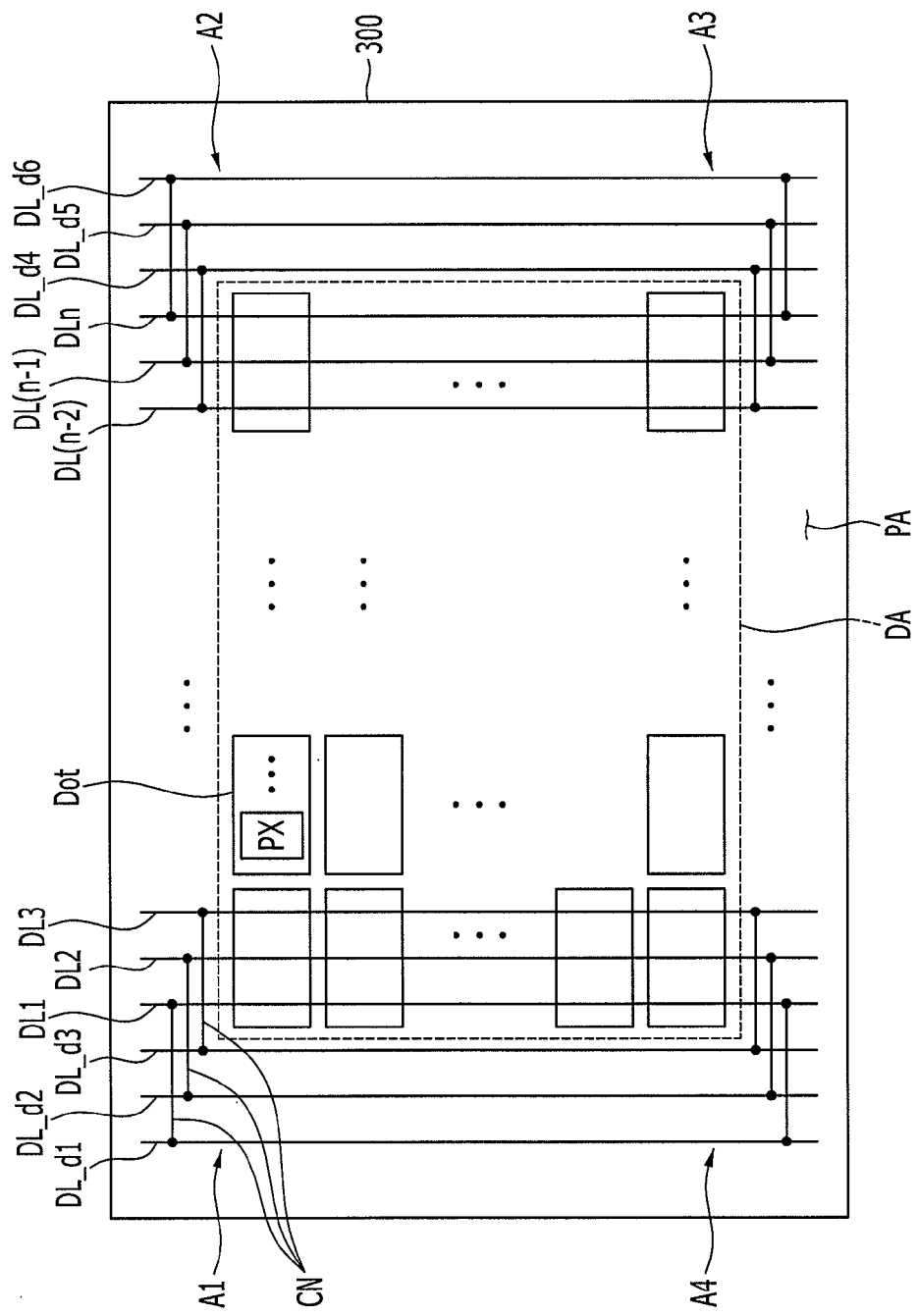
FIG. 1 is a layout view of a thin film transistor array panel according to an exemplary embodiment of the described technology.

Generally, a dummy data line which is not connected to a data driver is formed on a peripheral area of a thin film transistor array panel of a display device when required for design or driving. However, when a strong electric field is generated in a periphery of the dummy data line, charge may be accumulated in a pattern like the dummy data line, and the accumulated charge may cause light leakage in the edge of the display area.

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Throughout the specification, the term "connected" includes "electrically connected."

A thin film transistor array panel of a display device according to an exemplary embodiment of the present described technology will be described with reference to FIGS. 1 and 2.

Figure 2:
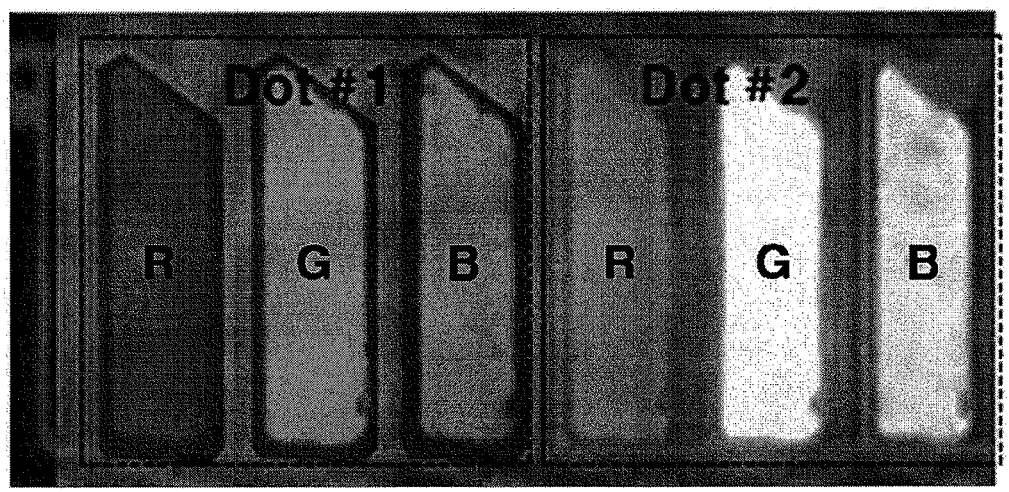
FIG. 2 is a layout view of a part of a thin film transistor array panel according to an exemplary embodiment.

FIG. 1 is a layout view of a thin film transistor array panel included in a display device according to an exemplary embodiment, and FIG. 2 is a picture illustrating luminance of a part of a thin film transistor array panel when displaying an image according to an exemplary embodiment.

Referring to FIG. 1 first, a display device according to an exemplary embodiment includes a thin film transistor array panel 300. The thin film transistor array panel 300 may be included in various flat panel displays (FPDs) such as a liquid crystal display (LCD), an organic light-emitting diode (OLED) display, an electrowetting display (EWD) or the like.

The thin film transistor array panel 300 includes a display area DA which displays an image and a peripheral area PA located around the display area DA.

A plurality of signal lines including a plurality of gate lines (not shown) and a plurality of data lines DL1, DL2, . . . , and DLn, are located in the display area DA. A plurality of pixels PX connected to the signal lines are also located in the display area DA.

The data lines DL transmit data voltages for an image signal and may extend substantially in a column direction substantially parallel to each other. Although not illustrated, the gate lines transmit gate signals and may extend substantially in a row direction substantially parallel to each other.

The pixels PX may be arranged in a substantially matrix form. A pixel PX may include at least one switching element (not shown) connected to at least one data line DL and at least one gate line. The pixel PX may further include at least one pixel electrode (not shown) connected to the switching element (not shown). The switching element may include at least one thin film transistor integrated in the thin film transistor array panel 300. The switching element may be controlled by the gate signal transmitted by the gate lines to transmit the data voltage transmitted by the data lines DL to the pixel electrode. The pixel PX may display a corresponding image according to the data voltage applied to the pixel electrode.

In order to display a color image, each pixel PX may display a primary color (spatial division) or may alternately display primary colors at predetermined times (temporal division) to allow a desired color to be recognized by a spatial or temporal sum of the primary colors. Examples of primary colors may include colors such as red, green, and blue, or yellow, cyan, and magenta.

Referring to FIG. 1, N (N is a natural number larger than or equal to 2) adjacent or nonadjacent pixels PX which display different primary colors may all be included in one dot Dot (hereinafter "Dot" will be used as reference character for "dot" as shown in FIG. 1), and one dot Dot may represent a full color such as white.

Although FIG. 1 illustrates one dot Dot consisting of a plurality of adjacent pixels PX in a row direction, the described technology is not limited thereto. One dot Dot may consist of a plurality of adjacent pixels PX in a column direction or adjacent pixels PX in both row and column directions.

According to an exemplary embodiment, one dot Dot may include at least one auxiliary pixel for improving color reproducibility or enhancing luminance in addition to the pixels PX which display a plurality of primary colors. For example, one dot Dot may further include a white pixel (not shown) which displays white as the auxiliary pixel to enhance the luminance of the dot Dot. The auxiliary pixel is not limited to being a white pixel and may include pixels of various colors such as yellow or a color including a combination of primary colors to improve color reproducibility. The layout of a plurality of primary color pixels and at least one auxiliary pixel within one dot Dot may be embodied by various configurations.

A light blocking member (not shown) including a plurality of openings may define an area in which light generated from the pixels may be emitted to the environment. The area defined by openings of the blocking member may be located at the display area DA of the thin film transistor array panel 300. The light blocking member of the display area DA is also referred to as a black matrix and prevents light leakage between pixels PX. At least a part of the signal lines such as the gate lines and the data lines DL located in the display area DA and the switching element may be covered by the light blocking member.

The peripheral area PA may surround the display area DA or may be located at an edge of the thin film transistor array panel 300. A driver (not shown) for driving the pixels PX or a plurality of pad portions connected to the driver may be located in the peripheral area PA.

The driver may include a gate driver connected to the gate lines or a data driver connected to the data lines DL.

The signal lines of the display area DA may extend to the peripheral area PA to be connected to an output terminal of the driver. The driver may be integrated in the thin film transistor array panel 300 together with the thin film transistor, may be directly mounted onto the thin film transistor array panel 300 in the form of at least one IC chip, or may be mounted onto a separate printed circuit board (PCB) (not shown).

The peripheral area PA may be covered by the light blocking member (not shown). Accordingly, the driver or the pad portions located in the peripheral area PA may be covered by the light blocking member.

Referring to FIG. 1, at least one dummy data line DL_d1, DL_d2, . . . , or DL_d6 is located in the peripheral area PA of the thin film transistor array panel 300. More specifically, at least one dummy data line DL_d is located at an outside of at least one edge of the display area DA.

FIG. 1 illustrates an example where three dummy data lines of the dummy data lines DL_d are located at peripheries of left and right edges of the display area DA, respectively. However, the described technology is not limited thereto and the dummy data lines DL_d may be located only at the outside of one edge of the display area DA.

Further, the number of the dummy data lines DL_d located at the outside of one edge of the display area DA is not limited to three. For example, when the number of data lines DL connected to the pixels PX of one dot Dot through the switching element to transmit the data voltage is k (k is a natural number), the number of dummy data lines DL_d located at the outside of one edge of the display area DA may be larger than or equal to k. For example, when the number of pixels PX included in one dot Dot is N and each of the pixels is connected to each of the data lines DL, the number of adjacent dummy data lines DL_d located at the outside of one edge of the display area DA may be larger than or equal to N. However, according to some embodiments, the number of dummy data lines DL_d located outside of one edge of the display area DA may be less than k.

Although not illustrated in FIG. 1, the dummy data lines DL_d may be connected to a dummy pixel electrode (not shown) through a dummy switching element (not shown) like the connections of the data lines DL of the display area DA. In this case, the dummy pixel electrode may also be located in the peripheral area PA and may be arranged in a substantially matrix form like the pixels PX of the display area DA.

The dummy data lines DL_d may extend in a substantially column direction substantially parallel to each other like the data lines DL of the display area DA. Further, during a process of manufacturing the display device, the dummy data lines DL_d may be formed of the same material as that of the data lines DL in the same manufacturing process.

At least one dummy data line DL_d and the dummy pixel electrode located at the peripheral area PA may be covered by the light blocking member.

The dummy data lines DL_d may not be directly connected to the data driver which applies the data voltage.

According to an exemplary embodiment, one group of adjacent data lines DL connected to the pixels PX of a dot Dot located at an outermost side of the display area DA are paired and electrically connected to respective dummy data lines DL_d. The group of data lines DL which transmit data voltages to the outermost dot Dot and are connected to the dummy data lines DL_d are referred to as "one group of data lines" hereinafter.

In contrast, the data lines connected to the pixels of a dot Dot column which is not located at the outermost side of the display area DA may not be connected to the dummy data lines DL_d of the peripheral area PA.

For example, the one group of data lines DL1, DL2, and DL3 which transmit data voltages to the pixels PX of a dot column adjacent to the left edge of the display DA are paired and connected to respective dummy data lines DL_d1, DL_d2, and DL_d3 located outside of the left edge of the display area DA. Similarly, the one group of data lines DL(n−2), DL(n−1), and DLn connected to the pixels PX of a dot column adjacent to the right edge of the display area DA are paired and connected to the respective dummy data lines DL_d4, DL_d5, and DL_d6 located outside of the right edge of the display area DA.

That is, there are two dot Dot columns located at the outermost sides of the display area DA arranged in the direction in which the data lines DL extend. The one group of data lines DL connected to the pixels PX of at least one of the two outermost dot Dot columns are paired and connected to the respective dummy data lines DL_d located in the adjacent peripheral area PA.

Accordingly, when the one group of data lines DL includes a plurality of data lines connected to the pixels PX of the outermost dot column, all the data lines DL of the corresponding group are paired and electrically connected to the respective dummy data lines DL_d of the adjacent peripheral area PA so that substantially the same RC delay and substantially the same load may be generated in the data lines DL of the corresponding group.

Accordingly, when the thin film transistor array panel 300 is driven, the luminance of the pixels PX of the outermost dot column substantially uniformly deteriorates when compared to a dot located in the interior of the display area DA. This deterioration may generate a color representation defect when an image is displayed with a polarized specific color.

For example, referring to FIG. 2, dots Dot#1 and Dot#2 illustrated in FIG. 2 are dots located in the display area DA. Dot Dot#1 on the left of the figure is a dot located at an edge of the display area DA and dot Dot#2 on the right is a dot located in the interior of the display area DA. FIG. 2 illustrates an example embodiment where dots Dot#1 and Dot#2 include red, green, and blue pixels R, G, and B. According to an exemplary embodiment, a data line connected to dot Dot#1 located at the edge of the display area DA is connected to a dummy data line in the peripheral area PA.

As illustrated in FIG. 2, the luminance of the pixels R, G, and B included in dot Dot#1 located at the edge of the display area DA are lower than luminance of the pixels R, G, and B included in dot Dot#2 when both dots Dot#1 and Dot#2 receive an image signal of the same gray scale.

Further, when the dummy data lines DL_d are formed in the peripheral area PA for various design or driving purposes, if the dummy data lines float, charge may be accumulated in the floating dummy data lines due to a peripheral electric field, and thus light leakage may be generated at the edge of the display area DA.

However, according to an exemplary embodiment, the one group of data lines DL of the outermost dot column are electrically connected to the adjacent dummy data lines DL_d, so that charge accumulated in the dummy data lines DL_d may be discharged and light leakage due to the accumulated charge may be prevented.

Further, the one group of data lines DL electrically connected to the dummy data lines DL_d experience a relatively large RC delay when compared with other data lines DL. Accordingly, the luminance of the pixels PX of the outermost dot column is relatively low in comparison with the luminance of other pixels PX in the interior of the display area DA when displaying the same gray scale. This can be seen with reference to FIG. 5.

For example, the RC delay generated in the one group of data lines DL connected to the dummy data lines DL_d may be approximately double the RC delay of other data lines DL. Accordingly, the luminance of the pixels PX connected to the one group of data lines DL may be approximately ½ of the luminance of other pixels PX when displaying the same gray scale. Therefore, it is possible to prevent display defects such as light leakage from being viewed in the pixels PX of the outermost dot Dot of the display area DA due to the electric field generated by a driver in the periphery of the display area DA, thereby improving the image quality at the edge of the display area DA.

Referring back to FIG. 1, according to an exemplary embodiment, the dummy data lines DL_d and the one group of data lines DL connected to each other may be connected through a connection bridge CN. The connection bridge CN may be located in the peripheral area PA and extend substantially in a row direction. The connection bridge CN may be formed on a different layer from that of the data lines DL and the dummy data lines DL_d.

According to an exemplary embodiment, the data lines DL and the dummy data lines DL_d which are paired and connected to each other may be sequentially connected to each other based on their arrangement order. That is, each data line DL of the one group of data lines DL may be connected to a corresponding dummy data line DL_d according to the order in which the lines are arranged on the thin film transistor array panel. In this case, the lengths of each of a plurality of connection bridges CN located at one side of the display area DA may be substantially the same. Accordingly, the RC delays of the one group of data lines DL connected to the dummy data lines DL_d may be substantially the same.

Although FIG. 1 illustrates an exemplary embodiment where both the group of the left data lines DL1, DL2, and DL3 and the group of the right data lines DL(n−2), DL(n−1), and DLn are connected to the pixels PX of the outermost two dot Dot columns, the described technology is not limited thereto. For example, only one of the groups of the data lines DL1 to DL3 and DL(n−2) to DLn may be connected to the dummy data lines DL_d.

Connection parts A1, A2, A3, and A4 may be located between the one group of data lines DL and the dummy data lines DL_d in the peripheral area PA.

The connection parts A1 to A4 connecting the one group of data lines DL and the dummy data lines DL_d may be located at only one end part or both end parts of the corresponding group of data lines DL. FIG. 1 illustrates an exemplary embodiment where the one group of data lines DL1, DL2, and DL3 connected to the leftmost dot column of the display area DA are connected to the dummy data lines DL_d1 to DL_d3 in the two connection parts A1 and A4 in an upper side and a lower side, respectively. The one group of data lines DL(n−2) to DLn connected to the rightmost dot column of the display area DA are similarly connected to the dummy data lines DL_d4 to DL_d6 in the two connection parts A2 and A3 in an upper side and a lower side, respectively.

Although the above description is based on a display device which employs a normally black mode, the described technology is not limited thereto. An exemplary embodiment of the described technology may be equally applied to a display device using a normally white mode. In this case, the luminance change according to the data voltage is reversed, and decreased luminance non-uniformity in the edge of the display area DA may be prevented instead of the above described prevention of light leakage.

The thin film transistor array panel of the display device according to an exemplary embodiment will now be described with reference to FIG. 3 together with the above described drawings. The same reference numerals are assigned to the same components as those of the aforementioned exemplary embodiment, and redundant descriptions thereof will be omitted.

Figure 3:
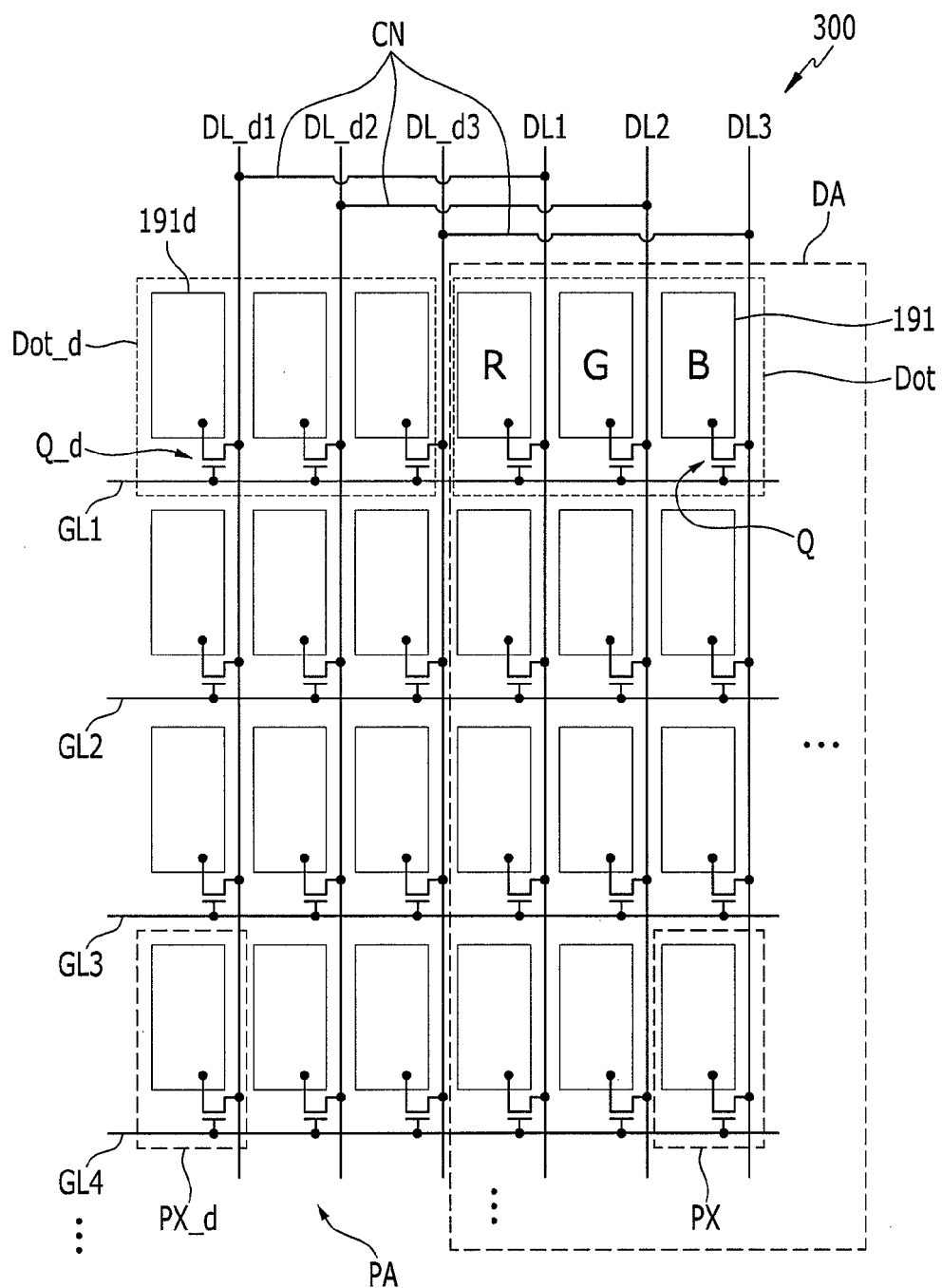
FIG. 3 is a layout view of a part of a thin film transistor array panel according to an exemplary embodiment.

FIG. 3 is a layout view of a part of the thin film transistor array panel according to an exemplary embodiment.

Referring to FIG. 3, a plurality of gate lines GL, a plurality of data lines DL, and a plurality of pixels PX connected to the signal lines are located in the display area DA of the thin film transistor array panel 300.

Each of the pixels PX may include at least one switching element Q connected to the data lines DL and the gate lines GL and at least one pixel electrode 191 connected to the switching element Q.

According to the present exemplary embodiment, each of the pixels PX may display a primary color such as red R, green G, or blue B. Accordingly, one dot may include a red pixel R, a green pixel G, and a blue pixel B. One dot may include a plurality of adjacent pixels PX in a row direction. Hereinafter, a pixel and a color represented by the pixel will be indicated by the same reference numeral.

At least one dummy data line DL_d1, DL_d2, or DL_d3 is located in the peripheral area PA of the thin film transistor array panel 300. Since the pixels PX of one dot are connected to three data lines DL1, DL2, and DL3 in the exemplary embodiment illustrated in FIG. 3, three or more dummy data lines DL_d1, DL_d2, and DL_d3 may be located at the peripheral area PA adjacent to the three data lines DL1, DL2, and DL3.

Further, a plurality of dummy pixels PX_d connected to the dummy data lines DL_d1, DL_d2, and DL_d3 may be located in the peripheral area PA of the thin film transistor array panel 300. The dummy pixel PX_d may include at least one dummy switching element Q_d connected to the dummy data lines DL_d1, DL_d2, and DL_d3 and the gate lines GL, and at least one dummy pixel electrode 191d connected to the dummy switching element Q_d.

According to an exemplary embodiment, the one group of data lines DL1, DL2, and DL3 connected to the R, G, and B pixels PX of a dot Dot located at the edge of the display area DA are paired and connected to the respective dummy data lines DL_d1, DL_d2, and DL_d3 located in the adjacent peripheral area PA. The dummy pixels PX_d connected to the dummy data lines DL_d1, DL_d2, and DL_d3 together form one dummy dot Dot_d.

More specifically, the data line DL1 located at the leftmost side of the display area DA illustrated in FIG. 3 may be connected to the dummy data line DL_d1 located at the leftmost side, the next data line DL2 may be connected to the next dummy data line DL_d2, and the last data line DL3 may be connected to the dummy data line DL_d3 located at the rightmost side. As described above, arrangement order of the data lines DL1, DL2, and DL3 and the dummy data lines DL_d1, DL_d2, and DL_d3 connected to each other may be the same.

The dummy data lines DL_d1, DL_d2, and DL_d3 and the data lines DL1, DL2, and DL3 connected to each other may be connected through connection bridges CN. According to an exemplary embodiment, when the arrangement order of the data lines DL1, DL2, and DL3 and the dummy data lines DL_d1, DL_d2, and DL_d3 connected to each other is the same, the lengths of respective connection bridges CN may be substantially the same. Accordingly, the load and RC delay of each the three data lines DL1, DL2, and DL3 may be substantially the same.

Next, the thin film transistor array panel of the display device according to an exemplary embodiment will be described with reference to FIG. 4 together with the above described drawings.

Figure 4:
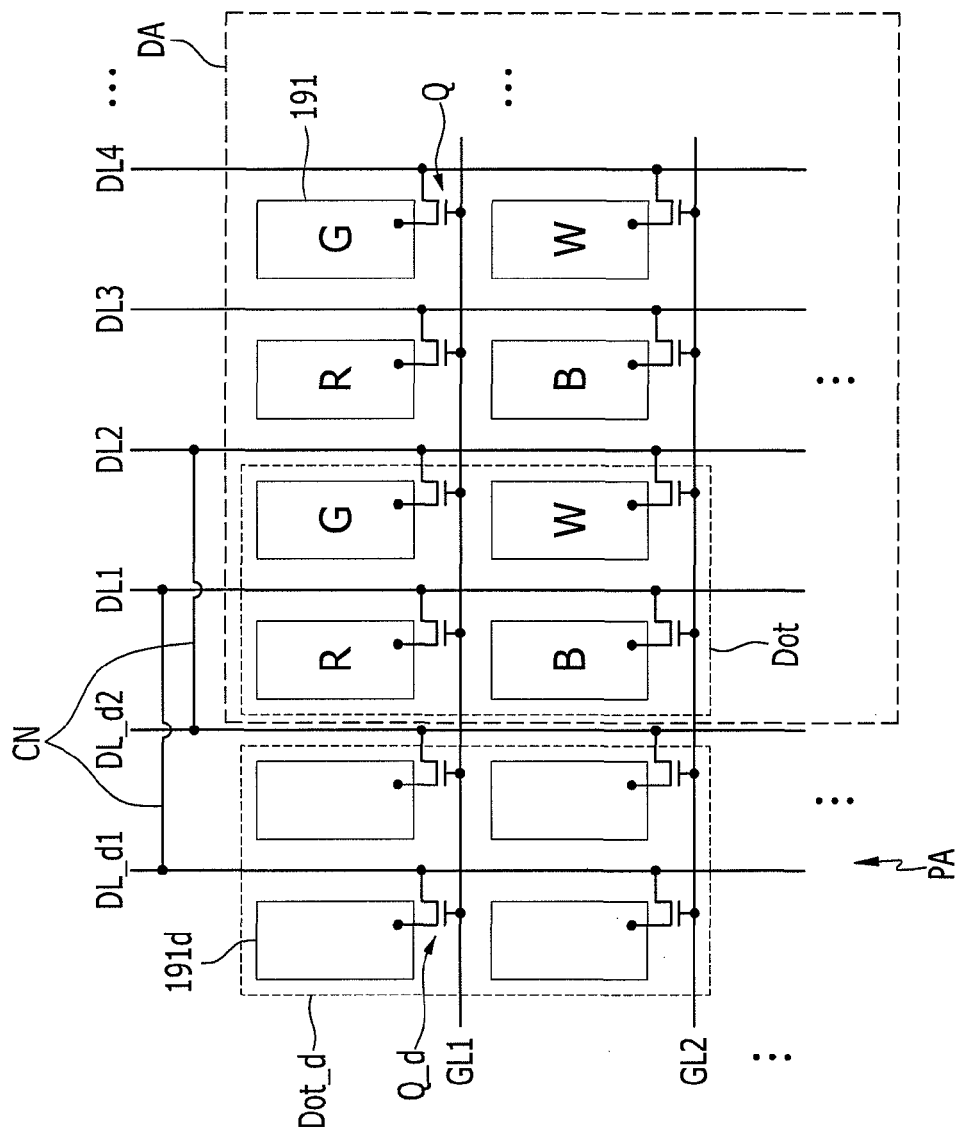
FIG. 4 is a layout view of a part of a thin film transistor array panel according to an exemplary embodiment.

FIG. 4 is a layout view of a part of the thin film transistor array panel according to an exemplary embodiment.

The exemplary embodiment illustrated in FIG. 4 is the same as the aforementioned exemplary embodiment illustrated in FIG. 3, but one dot Dot may further include a white pixel W which may display white as an auxiliary pixel in addition to the red, green, and blue pixels R, G, and B.

One dot Dot may include a plurality of pixels R, G, B, and W adjacent to each other in a row direction and a column direction and arranged in a substantially square shape. However, the arrangement order and shape of the four pixels R, G, B, and W may be variously changed.

In the exemplary embodiment illustrated in FIG. 4, the pixels R, G, B, and W of one dot Dot may be connected to two data lines DL. Each of the pixels R, G, B, and W may include at least one pixel electrode 191 and at least one switching element Q connected to the pixel electrode 191.

At least two dummy data lines DL_d1 and DL_d2 may be located in the peripheral area PA adjacent to the outermost dot Dot and adjacent to the edge of the display area DA.

A dummy dot Dot_d has substantially the same configuration as that of a dot Dot of the display area DA and may be located in the peripheral area PA of the thin film transistor array panel 300. That is, one dummy dot Dot_d may include a plurality of dummy pixel electrodes 191d connected to the dummy data lines DL_d1 and DL_d2 and arranged in a substantially square shape, and a plurality of dummy switching elements Q_d may be connected to the dummy pixel electrodes 191d.

According to the present exemplary embodiment, the one group of data lines DL1 and DL2 connected to the R, G, B, and W pixels PX of the outermost dot Dot located at the edge of the display area DA are paired and connected to the respective dummy data lines DL_d1 and DL_d2 located in the adjacent peripheral area PA. The dummy data lines DL_d1 and DL_d2 connected to the data lines DL1 and DL2 may be connected to the dummy pixel electrodes 191d of one dummy dot Dot_d through the dummy switching elements Q_d.

The arrangement order of the data lines DL1 and DL2 and the dummy data lines DL_d1 and DL_d2 connected to each other may be the same.

The dummy data lines DL_d1 and DL_d2 and the data lines DL1 and DL2 connected to each other may be connected through connection bridges CN. According to an exemplary embodiment, when the arrangement order of the data lines DL1 and DL2 and the dummy data lines DL_d1 and DL_d2 connected to each other are the same, the respective length of each connection bridge CN may be substantially the same. Accordingly, the load and RC delay of each of the one group of data lines DL1 and DL2 may be substantially the same.

Next, the thin film transistor array panel of the display device according to an exemplary embodiment will be described with reference to FIG. 5 together with the above described drawings.

Figure 5:
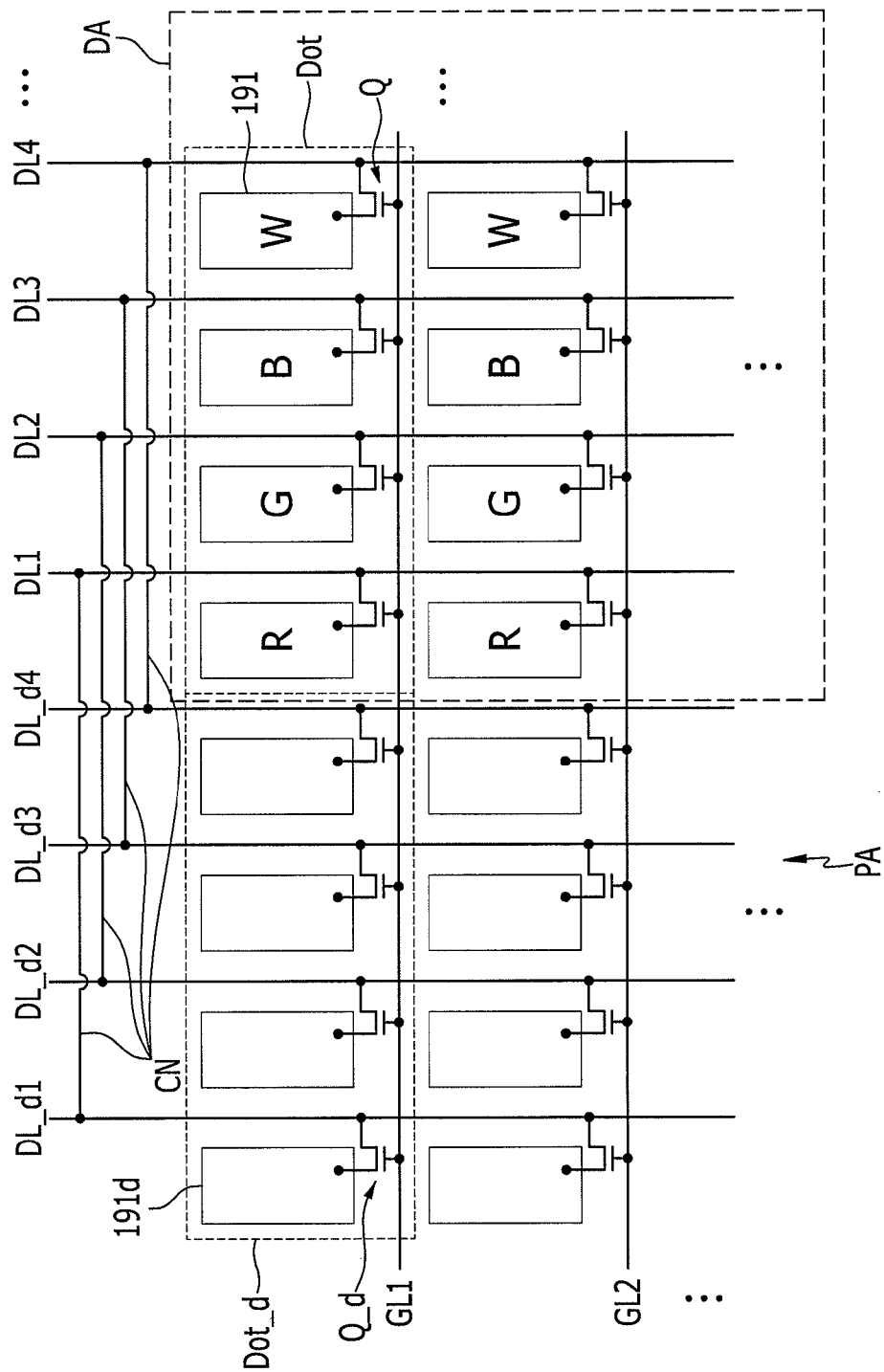
FIG. 5 is a picture illustrating luminance of a part of a thin film transistor array panel when displaying an image according to an exemplary embodiment.

FIG. 5 is a layout view of a part of the thin film transistor array panel according to an exemplary embodiment.

The exemplary embodiment illustrated in FIG. 5 is almost the same as the aforementioned exemplary embodiment illustrated in FIG. 4, but the arrangement of the R, G, B, and W pixels included in one dot Dot is different.

Referring to FIG. 5, the R, G, B, and W pixels included in one dot Dot may be arranged in a row direction in a line.

In the exemplary embodiment illustrated in FIG. 5, the pixels R, G, B, and W of one dot Dot may receive data voltages from respective data lines DL1, DL2, DL3, and DL4. Each of the pixels R, G, B, and W may include at least one pixel electrode 191 and at least one switching element Q connected to the pixel electrode 191.

At least four dummy data lines DL_d1, DL_d2, DL_d3, and DL_d4 may be located in the peripheral area PA adjacent to the outermost dot Dot and adjacent to the edge of the display area DA.

The dummy dot Dot_d has approximately the same configuration as that of a dot Dot of the display area DA is located in the peripheral area PA of the thin film transistor array panel 300. That is, a dummy dot Dot_d may include a plurality of dummy pixel electrodes 191d connected to the dummy data lines DL_d1 to DL_d4 and arranged in a row direction in a line. The dummy dot Dot_d may also include a plurality of dummy switching elements Q_d connected to the dummy pixel electrodes 191d.

According to an exemplary embodiment, the one group of data lines DL1 to DL4 connected to the R, G, B, and W pixels PX of the outermost dot Dot adjacent to the edge of the display area DA are paired and connected to the respective dummy data lines DL_d1 to DL_d4 located in the adjacent peripheral area PA.

The dummy data lines DL_d1 to DL_d4 connected to the data lines DL1 to DL4 may be connected to the dummy pixel electrodes 191d of dummy dots Dot_d through the dummy switching elements Q_d.

The arrangement order of the data lines DL1 to DL4 and the dummy data lines DL_d1 to DL_4 connected to each other may be the same.

The dummy data lines DL_d1 to DL_4 and the data lines DL1 to DL4 may be connected through connection bridges CN. According to an exemplary embodiment, when the arrangement order of the data lines DL1 to DL4 and the dummy data lines DL_d1 to DL_4 connected to each other are the same, the respective lengths of the connection bridges CN may be substantially the same. Accordingly, the load and RC delay of the one group of data lines DL1 to DL4 may be substantially the same.

The detailed structure of the thin film transistor array panel of the display device according to an exemplary embodiment will be described with reference to FIGS. 6 to 8 together with the above described drawings.

Figure 6:
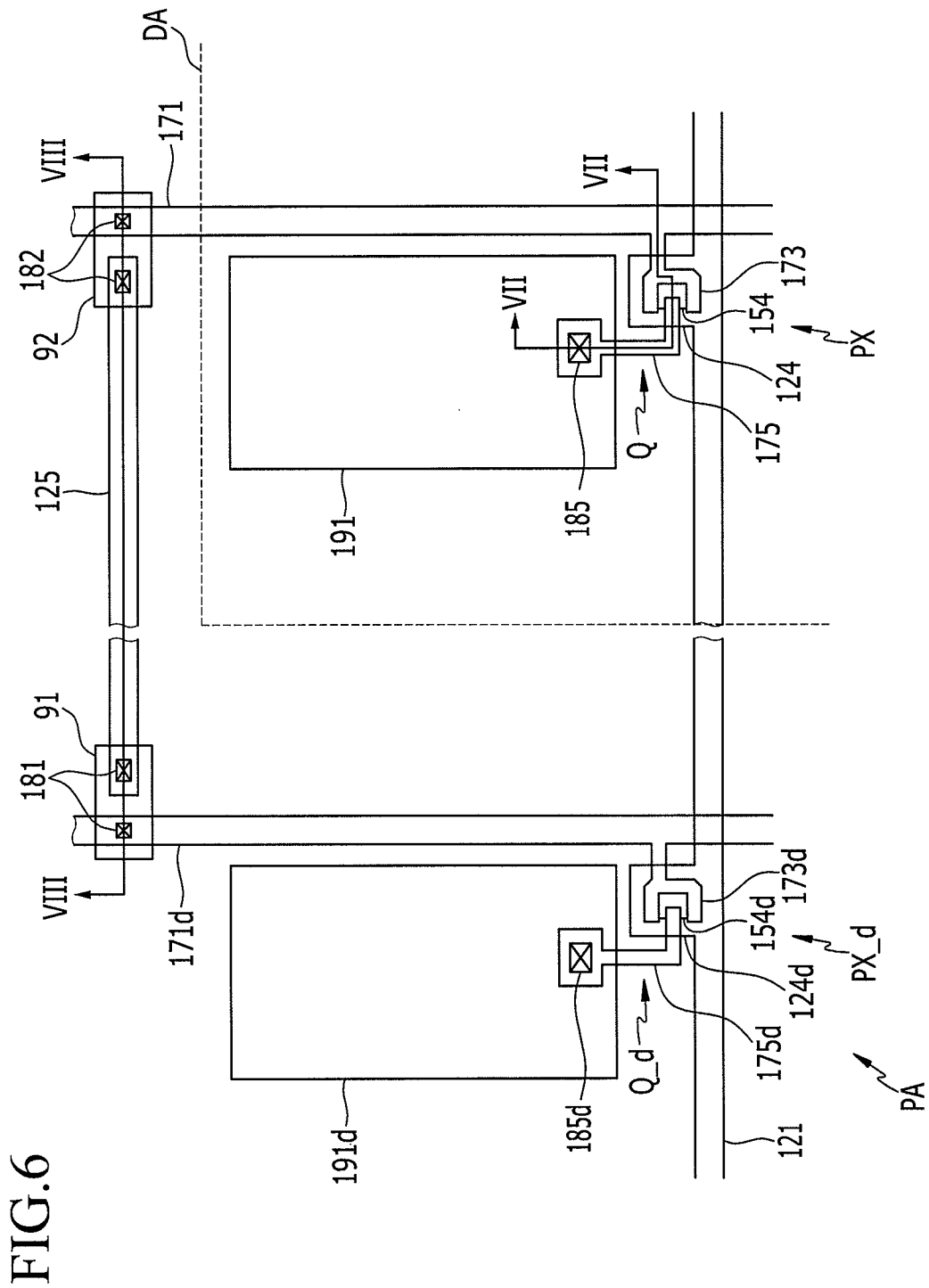
FIG. 6 is a top plan view illustrating a structure of a part of a thin film transistor array panel according to an exemplary embodiment.
Figure 7:
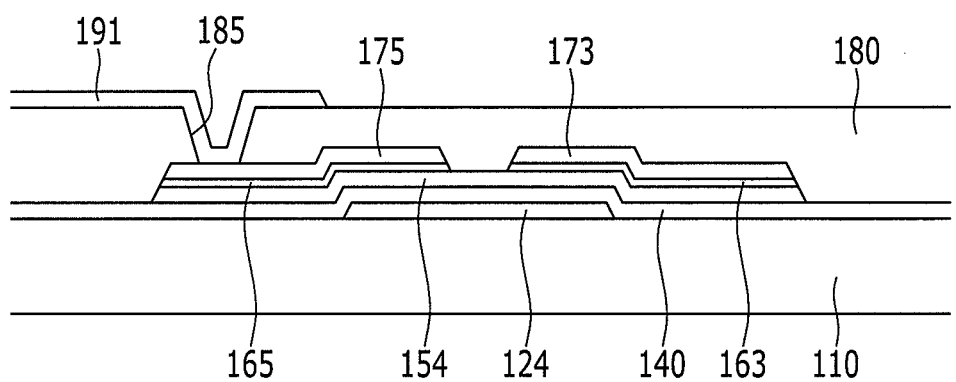
FIG. 7 is a cross-sectional view of the thin film transistor array panel of FIG. 6 taken along line VII-VII.
Figure 8:
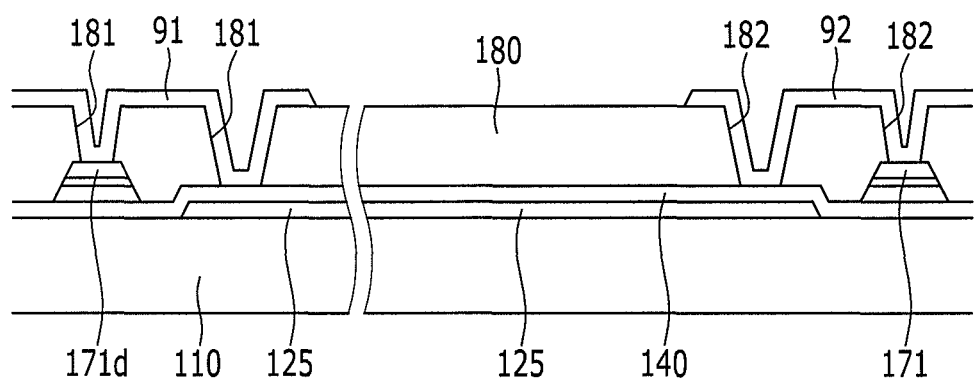
FIG. 8 is a cross-sectional view of the thin film transistor array panel of FIG. 6 taken along line VIII-VIII.

FIG. 6 is a top plan view illustrating the structure of a part of the thin film transistor array panel according to an exemplary embodiment, FIG. 7 is a cross-sectional view of the thin film transistor array panel of FIG. 6 taken along line VII-VII, and FIG. 8 is a cross-sectional view of the thin film transistor array panel of FIG. 6 taken along line VIII-VIII.

The thin film transistor array panel of the display device according to an exemplary embodiment may include an insulation substrate 110 made of transparent glass or plastic.

A plurality of gate lines 121 and a plurality of connection bridges 125 are located on the insulation substrate 110.

The gate lines 121 may transmit gate signals and extend in a substantially horizontal direction. The gate lines 121 may extend to the peripheral area PA as well as the display area DA of the thin film transistor array panel. The gate lines 121 may include a plurality of gate electrodes 124 located in the display area DA and at least one dummy gate electrode 124d located in the peripheral area PA.

The connection bridges 125 may extend in a substantially horizontal direction and may be located in the peripheral area PA. The connection bridge 125 may be located between a data line 171 located at the edge part of the display area DA and a dummy data line 171d located in the peripheral area PA adjacent to the data line 171. The connection bridge 125 may extend from the data line 171 located at the edge part of the display area DA to the dummy data line 171d.

A gate insulating layer 140 may be formed of silicon nitride (SiNx) or silicon oxide (SiOx) and is located on the gate line 121 and the connection bridge 125.

A plurality of semiconductors 154 may be located on the gate insulating layer 140 of the display area DA. Each of the semiconductors 154 is located on the gate electrode 124. A plurality of dummy semiconductors 154d may be located on the gate insulating layer 140 of the peripheral area PA. Each of the dummy semiconductors 154d may also be located on the dummy gate electrode 124d. The semiconductor 154 and the dummy semiconductor 154d may be formed of hydrogenated amorphous silicon, polysilicon, or oxide semiconductor.

A pair of ohmic contacts 163 and 165 may be located on each of the semiconductors 154 or dummy semiconductors 154d. The ohmic contacts 163 and 165 may be formed of a material such as highly concentrated n-type impurity doped with n+ hydrogenated amorphous silicon or silicide, or may be omitted.

The plurality of data lines 170 and at least one dummy data line 171d are located on the ohmic contacts 163 and 165 and the gate insulating layer 140. The data lines 171 are located in the display area DA and the dummy data line 171d is located in the peripheral area PA. Further, a plurality of drain electrodes 175 of the display area DA are located on the ohmic contacts 163 and 165 and the gate insulating layer 140. A dummy drain electrode 175d of the peripheral area PA may be further located on the ohmic contacts 163 and 165 and the gate insulating layer 140.

The data line 171 and the dummy data line 171d extend in a substantially vertical direction and cross the gate line 121. Each of the data lines 171 may include a source electrode 173 extending toward the gate electrode 124. Each of the dummy data lines 171d may include a dummy source electrode 173d extending toward the dummy gate electrode 124d.

The drain electrode 175 may face the source electrode 173, and the dummy drain electrode 175d may face the dummy source electrode 173d.

The gate electrode 124, the source electrode 173, and the drain electrode 175 may form a thin film transistor Q for a pixel PX together with the semiconductor 154. The dummy gate electrode 124d, the dummy source electrode 173d, and the dummy drain electrode 175d may similarly form a dummy thin film transistor Q_d for a dummy pixel PX_d together with the dummy semiconductor 154d.

A passivation layer 180 is located on the data line 171 and the dummy data line 171d. The passivation layer 180 may be formed of an inorganic electric insulator or an organic electric insulator.

The passivation layer 180 includes a contact hole 185 exposing the drain electrode 175 and a contact hole 185d exposing the dummy drain electrode 175d. Further, the passivation layer 180 includes a contact hole 181 exposing an end of the dummy data line 171d and an end of the connection bridge 125. The passivation layer 180 may further include a contact hole 182 exposing an end of adjacent data lines 171 and an end of the connection bridge 125. The contact holes 181 and 182 exposing the connection bridge 125 extend to the gate insulating layer 140.

A plurality of pixel electrodes 191 and a plurality of contact assistants 91 and 92 are located on the passivation layer 180.

The pixel electrode 191 is physically and electrically connected to the drain electrode 175 through the contact hole 185 and receives a data voltage from the drain electrode 175. Similarly, the dummy pixel electrode 191d may be physically and electrically connected to the dummy drain electrode 175d through the contact hole 185d.

The contact assistant 91 connects the end of the dummy data line 171d and one end of the connection bridge 125 through the contact hole 181. The contact assistant 92 connects the end of the data line 171 and the other end of the connection bridge 125 through the contact hole 182.

The pixel electrode 191 and the contact assistants 91 and 92 may be formed of a transparent conductive material such as ITO or IZO, or a reflective metal such as aluminum, silver, chromium or alloy thereof.

The thin film transistor Q and the pixel electrode 191 connected to the thin film transistor Q may together form one pixel PX in the display area DA, and the dummy thin film transistor Q_d and the dummy pixel electrode 191d connected to the dummy thin film transistor Q_d may together form one dummy pixel PX_d in the peripheral area PA.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
    a display area including a plurality of pixels; a peripheral area formed around the display area and including a first peripheral area disposed at a side of the display area;
    a plurality of data lines configured to respectively apply a plurality of data voltages to the pixels, the data lines including a plurality of first data lines at least a portion of which is disposed in the display area; and
    a plurality of first dummy data lines substantially formed in the first peripheral area and extending along a first boundary edge between the display area and the first peripheral area,
    wherein a dot including a plurality of pixels representing different colors from one another has TFTs connected to the first data lines, the dot being adjacent to the first boundary edge, and
    wherein each of the first data lines makes a pair with and electrically connected to each one of at least a portion of the first dummy data lines.

2. The thin film transistor array panel of claim 1, wherein the first data lines and the first dummy data lines are electrically connected to each other according to their order of arrangement on the thin film transistor array panel.

3. The thin film transistor array panel of claim 1, further comprising:
    a connection part; and
    a plurality of connection bridges electrically connecting the first data lines and the first dummy data lines at the connection part.

4. The thin film transistor array panel of claim 3, wherein the connection part is formed in the peripheral area.

5. The thin film transistor array panel of claim 3, wherein the connection bridge is formed in a different layer from that of the first data lines and the first dummy data lines.

6. The thin film transistor array panel of claim 1, further comprising:
    a plurality of connection parts; and
    a plurality of connection bridges electrically connecting the first data lines and the first dummy data lines at the connection parts.

7. The thin film transistor array panel of claim 6, wherein the connection parts comprise two connection parts formed at respective ends of the first data lines.

8. The thin film transistor array panel of claim 1, wherein the number of the first data lines is equal to or less than the number of the pixels included in the dot.

9. The thin film transistor array panel of claim 1, further comprising:

a dummy pixel electrode formed in the peripheral area.

10. The thin film transistor array panel of claim 9, further comprising:

a light blocking member formed over the dummy pixel electrode and the first dummy data lines.

11. A display device comprising:

a display area including a plurality of pixels;

a peripheral area formed around the display area, the peripheral area including a first peripheral area disposed at a side of the display area;

a plurality of data lines configured to respectively apply a plurality of data voltages to the pixels, the data lines including a plurality of first data lines at least a portion of which is disposed in the display area; and a plurality of first dummy data lines substantially formed in the first peripheral area and extending along a first boundary edge between the display area and the first peripheral area, wherein a dot including a plurality of pixels representing different colors from one another have TFTs connected to the first data lines, the dot being adjacent to the first boundary edge, and wherein each of the plurality of first data lines makes a pair with and electrically connected to each one of at least a portion of the first dummy data lines.

12. The display device of claim 11, wherein the first data lines and the first dummy data lines are electrically connected to each other according to their order of arrangement.

13. The display device of claim 11, further comprising a connection part; and a plurality of connection bridges formed at the connection part, wherein the first data lines and the first dummy data lines are electrically connected to each other through the connection bridges.

14. The display device of claim 13, wherein the connection part is formed in the peripheral area.

15. The display device of claim 13, wherein the connection bridges are formed in a different layer from that of the first data lines and the first dummy data lines.

16. The display device of claim 11, further comprising:

a light blocking member formed over the peripheral area.

* * * * *